United States Patent
Park et al.

(10) Patent No.: US 8,054,256 B2
(45) Date of Patent: Nov. 8, 2011

(54) DRIVING CIRCUIT AND ORGANIC LIGHT EMITTING DISPLAY USING THE SAME

(75) Inventors: Yong-Sung Park, Suwon-si (KR); Do-Youb Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 980 days.

(21) Appl. No.: 12/003,944

(22) Filed: Jan. 3, 2008

(65) Prior Publication Data

US 2008/0218456 A1 Sep. 11, 2008

(30) Foreign Application Priority Data

Mar. 8, 2007 (KR) .................. 10-2007-0022939

(51) Int. Cl.
  *G09G 3/30* (2006.01)
(52) U.S. Cl. ............... 345/77; 345/76; 341/144
(58) Field of Classification Search .......... 345/76–82, 345/98; 341/144, 154
  See application file for complete search history.

(56) References Cited

U.S. PATENT DOCUMENTS

| | | | |
|---|---|---|---|
| 6,486,817 B1 | 11/2002 | Okada et al. | |
| 6,600,436 B2 | 7/2003 | Tanaka | |
| 6,781,536 B1 * | 8/2004 | Martins | 341/144 |
| 2004/0217892 A1 * | 11/2004 | Hu et al. | 341/144 |
| 2006/0125761 A1 * | 6/2006 | Ahn | 345/98 |
| 2006/0232520 A1 * | 10/2006 | Park et al. | 345/76 |
| 2007/0279336 A1 * | 12/2007 | Park | 345/76 |
| 2007/0279341 A1 * | 12/2007 | Park | 345/77 |
| 2007/0279342 A1 * | 12/2007 | Park | 345/77 |

FOREIGN PATENT DOCUMENTS

| | | |
|---|---|---|
| JP | 09258695 A | 10/1997 |
| JP | 2001-257595 | 9/2001 |
| JP | 2002026732 A | 1/2002 |
| JP | 2007019801 A | 1/2007 |
| KR | 1020060011509 A | 2/2006 |
| KR | 10-2006-0076756 | 7/2006 |

OTHER PUBLICATIONS

Notice of Allowance issued by the KIPO on Dec. 26, 2008 in Applicant's corresponding Korean application No. 10-2007-0022939.

* cited by examiner

*Primary Examiner* — Alexander Eisen
*Assistant Examiner* — Viet Pham
(74) *Attorney, Agent, or Firm* — Robert E. Bushnell, Esq.

(57) ABSTRACT

Disclosed are a driving circuit and an organic light emitting display using the same, which realizes stable gray levels. The driving circuit includes a first selector that produces a first selection and sub selection signals, and a second selector that produces a second selection and sub selection signals. The driving circuit also includes a first voltage divider and a second voltage divider, each of which receives the selection signals. The first and the second voltage dividers can produce various voltage levels depending on the various combination of the selection signals.

31 Claims, 8 Drawing Sheets

DRIVING CIRCUIT AND ORGANIC LIGHT EMITTING DISPLAY USING THE SAME

CLAIM OF PRIORITY

This application makes reference to, incorporates the same herein, and claims all benefits accruing under 35 U.S.C. §119 from an application for DRIVING CIRCUIT AND ORGANIC LIGHT EMITTING DISPLAY USING THE SAME earlier filed in the Korean Intellectual Property Office on the 8th of Mar. 2007 and there duly assigned Serial No. 10-2007-0022939.

BACKGROUND OF THE INVENTION

1. Field of the Invention

The present invention relates to a driving circuit and an organic light emitting display including the driving circuit, more particular to a driving circuit, which may reduce errors in realizing gray levels by preventing a voltage drop occurring in an analog switch in order to improve the linearity, and an organic light emitting display including the driving circuit.

2. Description of the Related Art

In a flat panel display device, a plurality of pixels are formed on a substrate and forms a display region. A scan line and a data line are coupled to each of the pixels, and an image is displayed by applying driving signals to the pixels.

Flat panel display is classified into an active matrix type luminescence display and a passive matrix type luminescence display according to its driving method. These types of flat panel displays have been used for display devices of portable information terminals such as a personal computer, a portable telephone, and a personal digital assistant (PDA), and monitors of all kinds of information devices. A liquid crystal display (LCD) including a liquid crystal panel, an organic light emitting display including an organic light emitting diode, and a plasma display panel (PDP) including a plasma panel are examples of flat panel displays. Recently, various flat plate displays capable of reducing weight and volume have been developed overcoming the disadvantages of bulky cathode ray tubes (CRT).

FIG. 2 is a circuitry diagram showing a resistor unit for generating various voltage levels in a D/A converter, which can be used in a data driver of an organic light emitting display. Specifically, FIG. 2 shows a resistor unit for generating eight voltage levels. In order to generate eight voltage levels, eight resistors are serially coupled to each other. A first reference voltage having a higher voltage and a second reference voltage having a lower voltage are applied across the resistors. The difference of the first reference voltage and the second reference voltage are divided by the 8 resistors to obtain divided voltages, which are data voltages.

The D/A converter shown in FIG. 2 generates 8 data voltage levels, which are divided by the 8 resistors. Since the number of the data voltage levels is fixed, the number of gray levels to be generated is also fixed. Therefore, in order to generate another gray levels such as 256 gray levels, 128 gray levels, and 64 gray levels, the D/A converter should have another circuit design that is different from the circuit shown in FIG. 2. Because the data driver includes an unique resistor unit for achieving a specific gray levels, the data driver should be replaced in order to realize another gray levels, which causes inconvenience and reduces flexibility.

SUMMARY OF THE INVENTION

Accordingly, it is an aspect of the present invention to provide a driving circuit that is capable of achieving various gray levels, and an for driving an organic light emitting display including the driving circuit.

A first aspect of the present invention is achieved by providing a driving circuit for generating a data voltage. The driving circuit comprises a first decoder, a first selector, a switch unit, a second decoder, a second selector, a first voltage divider, and a second voltage divider including a first divider unit and a second divider.

The first decoder receives a first bit set of a digital data signal and outputs a first decoding signal. The first selector receives a third bit set of the digital data signal and the first decoding signal, and outputs a first selection signal and a first sub selection signal. The switch unit for receives the first selection signal and the first sub selection signal, and also receives a first reference voltage and a second reference voltage. Magnitude of the second reference is smaller than magnitude of the first reference voltage. The switch unit outputs a first switch output voltage and a second switch output voltage. Each of magnitude of the first switch output voltage and magnitude of the second switch output voltage depends on magnitude of the first selection signal. The second decoder receives a second bit set of the digital data signal, and outputs a second decoding signal. The second selector receives a fourth bit set of the digital data signal and the second decoding signal, and outputs a second selection signal and a second sub selection signal. The first voltage divider receives the first switch output voltage and the second switch output voltage, and also receives the second selection signal and the second sub selection signal. The first voltage divider outputs a first output voltage. Magnitude of the first output voltage depends on magnitude of the second selection signal. The first divider unit of the second voltage divider receives the first switch output voltage and the second switch output voltage, and also receives the second selection signal. The first divider unit outputs a second output voltage. Magnitude of the second output voltage depends on magnitude of the second selection signal. The second divider unit of the second voltage divider receives the first switch output voltage and the second switch output voltage, and also receives the second sub selection signal. The second divider unit outputs a third output voltage. Magnitude of the third output voltage depends on magnitude of the second sub selection signal.

The third bit set may include a single bit of the digital data signal, and the fourth bit set may include a single bit of the digital data signal.

The switch unit may comprise a first transistor, a second transistor, a third transistor, and a fourth transistor. The first transistor receives the first reference voltage, and operation of the first transistor is controlled by the first selection signal. The second transistor receives the first reference voltage, and operation of the second transistor is controlled by the first sub selection signal. The first switch output voltage is outputted from the first transistor or from the second transistor. The third transistor receives the second reference voltage, and operation of the third transistor is controlled by the first selection signal. The fourth transistor receives the second reference voltage, and operation of the fourth transistor is controlled by the first sub selection signal. The second switch output voltage is outputted from the third transistor or from the fourth transistor.

The first voltage divider may comprise a fifth transistor, a sixth transistor, a seventh transistor, a eighth transistor, a first resistor, a second resistor, and a third resistor. The fifth transistor receives the first switch output voltage, and operation of the fifth transistor is controlled by the second selection signal. The sixth transistor receives the first switch output voltage, and operation of the sixth transistor is controlled by the second sub selection signal. The seventh transistor receives an output voltage from the fifth transistor or from the sixth transistor, and operation of the seventh transistor is controlled by the second selection signal. The eighth transistor receives the second switch output voltage, and operation of the eighth transistor is controlled by the second sub selection signal. The first resistor is coupled between the seventh transistor and the fifth transistor. The second resistor is coupled between the seventh transistor and the eighth transistor. The third resistor is coupled between the eighth transistor and an output terminal of the switch unit from which the second switch output voltage is outputted.

The first divider unit of the second voltage divider may comprise a second-fifth transistor, a second-seventh transistor, a second-first resistor, and a second-second resistor. The second-fifth transistor receives the first switch output voltage, and operation of the second-fifth transistor is controlled by the second selection signal. The second-seventh transistor receives an output voltage from the second-fifth transistor, and operation of the second-seventh transistor is controlled by the second selection signal. The second-first resistor is coupled between the second-fifth transistor and the second-seventh transistor. The second-second resistor is coupled between the second-seventh transistor and an output terminal of the switch unit from which the second switch output voltage is outputted.

The second divider unit of the second voltage divider may comprise a second-sixth transistor, a second-eighth transistor, a ninth transistor, and a second-third resistor. The second-sixth transistor receives the first switch output voltage, and operation of the second-sixth transistor is controlled by the second sub selection signal. The second-eighth transistor receives an output voltage from the second-sixth transistor, and operation of the second-eighth transistor is controlled by the second sub selection signal. The ninth transistor receives the second switch output voltage, and operation of the ninth transistor is controlled by magnitude of a bit signal outputted from the third bit set of the digital signal. The second-third resistor is coupled between the second-eighth transistor and the ninth transistor.

Resistance of the fifth transistor may be substantially the same as resistance of the second-fifth transistor. Resistance of the sixth transistor may be substantially the same as resistance of the second-sixth transistor. Resistance of the first resistor may be substantially the same as resistance of the second-first resistor. Resistance of the third resistor may be substantially the same as resistance of the second-second resistor and resistance of the second-third resistor. The magnitude of the first output voltage may further depend on magnitude of the first selection signal.

A second aspect of the present invention is achieved by providing a data driver comprising a shift register for sequentially outputting a control signal, a latch for receiving digital data signals in series and outputting the digital data signals in parallel, and a digital-analog converter that includes the driving circuit of the first aspect of the present invention. The process of converting the data signal from series to parallel is controlled by the control signal.

A third aspect of the present invention is achieved by providing an organic light emitting display comprising a pixel unit for receiving a data voltage and a scan signal and for displaying images, a scan driver for generating the scan signal, and a data driver for generating the data voltage and including the driving circuit of the first aspect of the present invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
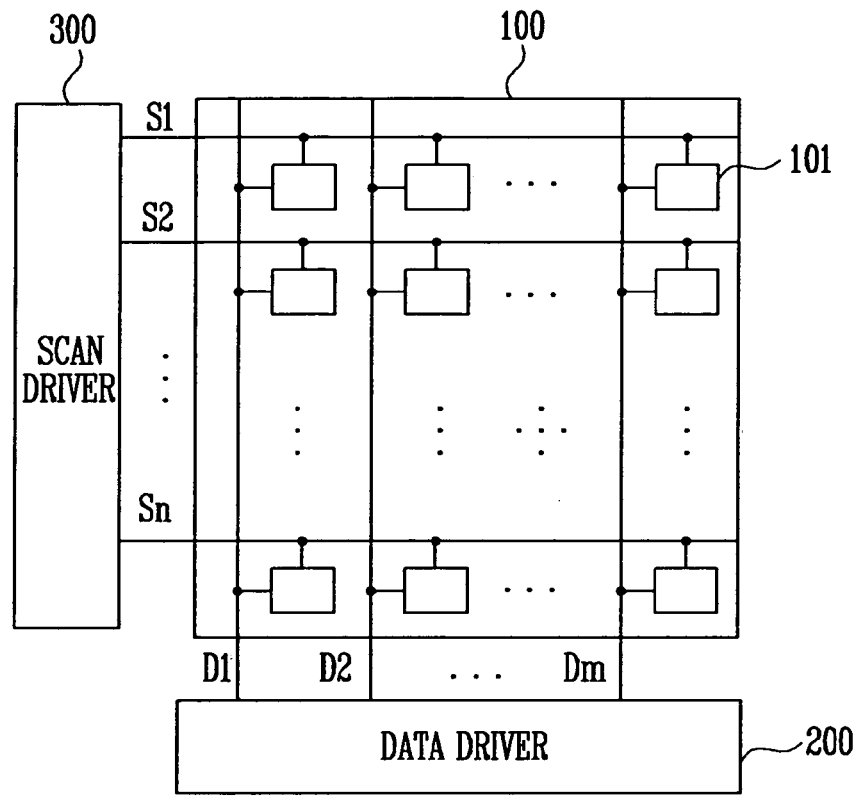
FIG. 1 is a block diagram showing a circuit arrangement of an organic light emitting display.
Figure 2:
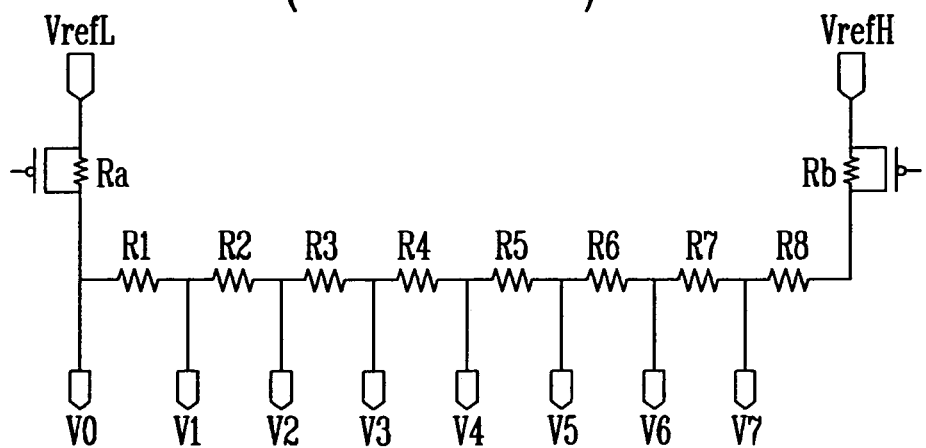
FIG. 2 is a circuit diagram showing a resistor unit for generating eight voltage levels in a digital-analogue (D/A) converter, which can be used in a data driver of an organic light emitting display.

Hereinafter, preferable embodiments of the present invention will be described with reference to the accompanying drawings. Here, when one element is coupled to another element, one element may be not only directly coupled to another element but also indirectly coupled to another element via another element. Irrelevant elements are omitted for clarity. Also, like reference numerals refer to like elements throughout.

FIG. 1 is a block diagram showing a circuit arrangement of an organic light emitting display. With reference to FIG. 1, the organic light emitting display includes a pixel unit 100, a data driver 200, and a scan driver 300. The pixel unit 100 includes a plurality of data lines D1, D2, ... Dm-1, Dm, and a plurality of scan lines S1, S2, ..., Sn-1, Sn. The pixel unit 100 includes a plurality of pixels 101, which are connected to the plurality of data lines D1, D2, ..., Dm-1, Dm, and the plurality of scan lines S1, S2, ..., Sn-1, Sn. Each of the pixels 101 includes a pixel circuit and an organic light emitting diode. The pixel circuits of the pixels 101 control pixel current flowing through the pixel. In other words, the pixel circuit controls flow of current that flows into the organic light emitting diode according to a data signal transferred through the plurality of data lines D1, D2, ..., Dm-1, Dm and the scan signal transferred through the plurality of scan lines S1, S2, ..., Sn-1, Sn.

The data driver 200 is coupled to the plurality of data lines D1, D2, ..., Dm-1, Dm. The data driver 200 generates data signals, and each of the data signals is sequentially applied to one of the data lines D1, D2, ..., Dm-1, Dm. The data driver 200 includes a digital-analog (D/A) converter. The data driver 200 generates a voltage signal that is converted into an analog signal from a digital signal, and transfers the voltage signal to the data lines D1, D2, ..., Dm-1, Dm.

The scan driver 300 is coupled to the plurality of scan lines S1, S2, . . . , Sn-1, Sn. The scan driver 300 generates and transfers the scan signal to the plurality of scan lines S1, S2, . . . , Sn-1, Sn. A specific scan line is selected for a scan signal, and a data signal is transferred to a pixel 101 positioned at the specific scan line, so that electric current is generated in a pixel corresponding to the data signal and the scan signal.

Figure 3:
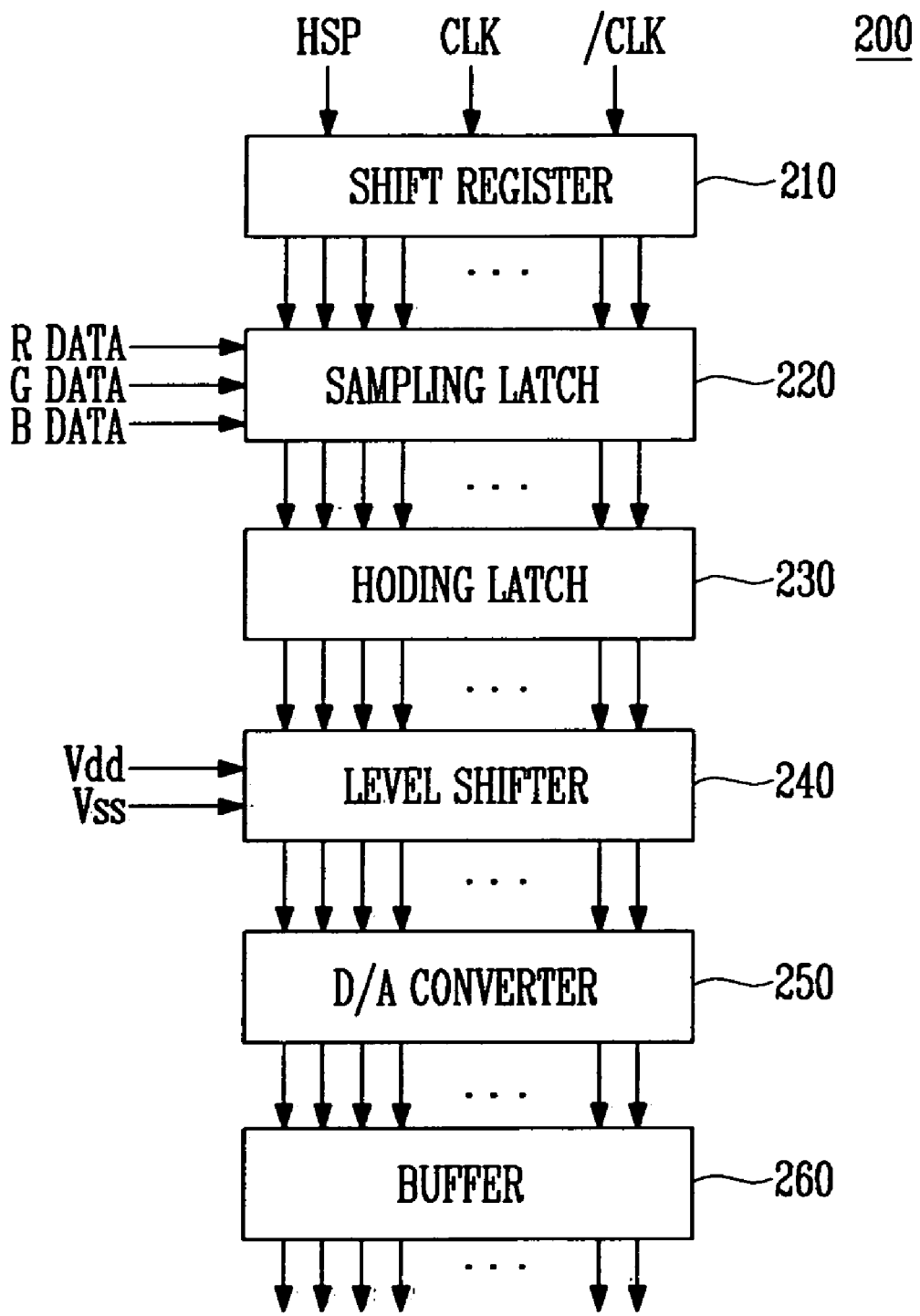
FIG. 3 shows elements included in a data driver used to drive an organic light emitting display.

FIG. 3 shows elements included in a data driver used to drive an organic light emitting display. Referring to FIG. 3, the data driver 200 includes a shift register 210, a sampling latch 220, a holding latch 230, a level shifter 240, a digital-analog (D/A) converter 250, and a buffer 260.

The shift register 210 is composed of a plurality of flip-flops. The shift register 210 controls the sampling latch 220 according to a clock signal CLK and a synchronous signal HSP. The sampling latch 220 sequentially receives data signals, R DATA, G DATA, and B DATA, and outputs the data signals in parallel according to the control signal received from the shift register 210. A method of receiving data in series and outputting the data in parallel is referred to as "serial input and parallel output." The holding latch 230 receives the signals in parallel, and outputs the signals in parallel. A method of receiving data in parallel and outputting the data in parallel is referred to as "parallel input and parallel output (PIPO)." The level shifter 240 changes the levels of the output signals of the holding latch 230 to levels of an operation voltage of a system based on the voltage levels Vdd and Vss, and transfers the signals to the D/A converter 250. The D/A converter 250 converts a digital signal into an analog signal. The D/A converter 250 selects and transfers a voltage corresponding a gray level to the buffer 260. The buffer 260 amplifies the selected voltage, and transfers the amplified voltage to a data line.

Figure 4:
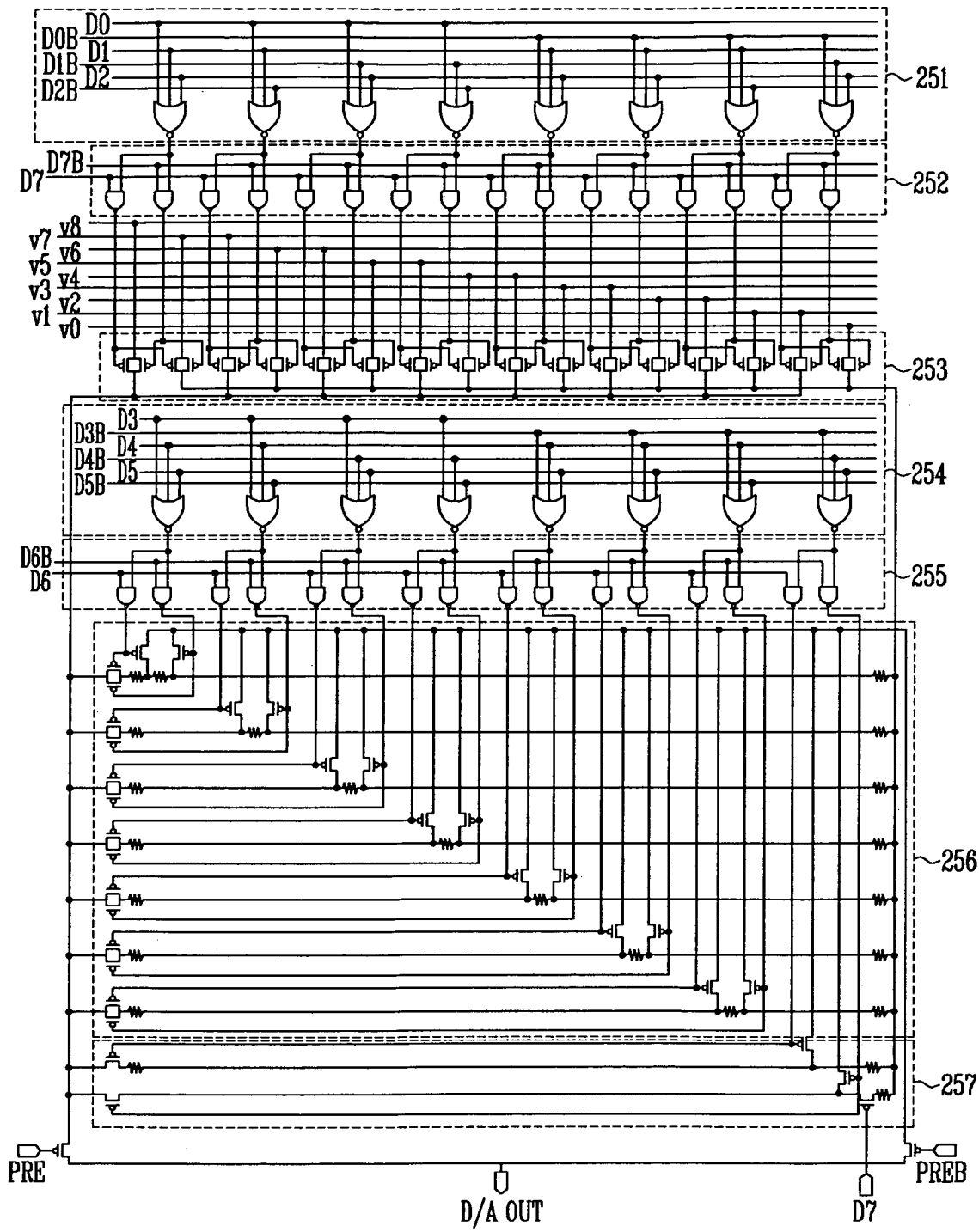
FIG. 4 is a circuit diagram included in a digital-analog (D/A) converter constructed according to the principles of the present invention.

FIG. 4 is a circuit diagram constructed in a digital/analog (D/A) converter of the present invention. The D/A converter 250 includes a first decoder 251, a first selector 252, a switch unit 253, a second decoder 254, a second selector 255, and a data voltage generator that includes a first voltage divider 256 and a second voltage divider 257. In the circuit shown in FIG. 4, it is assumed that the D/A converter 250 realizes maximum 256 gray levels, and a data signal transferred to the D/A converter 250 can be 6, 7, or 8 bit signal.

The first decoder 251 generates first eight decoding signals using upper 3 bits of the digital data signal. The first decoder 251 includes eight NOR gates. The first decoder 251 generates first eight decoding signals using upper 3 bits of the digital data signal, which can be represented by 3 upper bit values (D0, D1, and D2) and their complementary bit values (D0B, D1B, and D2B). The first decoder 251 selects one of the eight NOR gates in order to output a first decoding signal. For convenience, the far left NOR gate is referred to as a first NOR gate. The group of the upper 3 bits is referred to as a first bit set.

The first selector 252 includes a plurality of NAND gates, each of which has two input terminals. The first selector 252 generates eight first selection signals and eight first sub selection signals. There are sixteen NAND gates, which can be grouped in eight pairs in total in a way that two NAND gates form one pair. For convenience, two NAND gates forming one pair are referred to as a first NAND gate and a second NAND gate, respectively One input terminal of the first NAND gate is coupled to an output terminal of the first NOR gate and receives the first decoding signal. Another input terminal of the first NAND gate is coupled to a bit value D7, of the data signal. One input terminal of the second NAND gate is coupled to an output terminal of the first NOR gate and receives the first decoding signal. Another input terminal of the second NAND gate is coupled to a complementary bit value D7B of the data signal. Herein, if a bit value (such as "1") is referred to as a positive bit value, its complementary bit value (such as "0") can be referred to as a negative bit value. A single bit represents a positive bit value or a negative bit value. Through a signal line transferred through the positive signal line and the negative signal line, the first NAND gate outputs a first selection signal, and the second NAND gate outputs a first sub selection signal. A bit value of a bit of the data signal is transferred to the positive signal line, and a complementary bit value of the bit of the data signal is transferred to the negative signal line. In other words, a signal of "1" is transferred to the positive signal line and a signal of "0" is transferred to the negative signal line. The bit representing D7 or D7B can be referred to as a third bit set. If the data signal is 8 bit signals, the bit value D7 of the lowest bit among 8 bit signals is transferred to the positive signal line. If the data signal is 7 or 6 bit signals, a bit value of "1" is always transferred to the positive signal line.

A pair of transistors in the switch unit 253 selects two of nine reference voltages V0, V1, . . . , V8 in order to select a first reference voltage and a second reference voltage among the plurality of the reference voltages. Here, the second reference voltage has a level lower than that of the first reference voltage. The switch unit 253 is composed of 32 transistors in total. Two transistors form one switch, and therefore there are sixteen switches in total. The far left transistor of the far left switch is referred to as first transistor, and the next far left transistor of the far left switch is referred to as second transistor. Source terminals of the two transistors are commonly coupled to one of nine reference voltage lines. Gate of the first transistor is coupled to the output of the first NAND gate, and gate of the second transistor is coupled to the output of the second NAND gate.

As shown in the circuit of FIG. 4, if a first selection signal is outputted through the first NAND gate, the first transistor and the third transistor are turned on. In this case, the first reference voltage (V8) and the second reference voltage (V7) are inputted to the first transistor and the third transistor, respectively. The first transistor outputs a first switch output voltage, and the third transistor outputs a second switch output voltage. Also, if a second selection signal is outputted through the second NAND gate, the second transistor and the fourth transistor are turned on, so that the first reference voltage (V8) and the second reference voltage (V7) are inputted to the second transistor and the fourth transistor, respectively. In this case, the second transistor outputs a first switch output voltage, and the fourth transistor outputs a second switch output voltage. Because the resistance of the first and the second transistors may be different, the magnitude of the first switch output voltages outputted from the first transistor and the second transistor may be different. With the same reason, the magnitude of the second switch output voltage outputted from the third and the fourth transistor may be different. In other words, the magnitude of the first and the second switch output voltages may depends on whether the first or the second selection signals is outputted. Because the first and the second selection signals are bit signals that can be represented as one or zero, it also can be described that the magnitude of the first and second switch output voltage depend on the magnitude of the first and the second selection signals.

The second decoder 254 generates eight second decoding signals using lower 3 bits of the data signal. The second decoder 254 includes eight NOR gates. The second decoder 254 generates eight first decoding signals using bit values (D3, D4, and D5) of lower 3 bit signals of the digital data signal and their complementary bit values (D3B, D4B, and D5B), and selects one of the eight NOR gates in order to output a second decoding signal. For convenience, the far left NOR gate is referred to as ninth NOR gate. The group of the lower 3 bits is referred to as a second bit set.

The second selector 255 includes a plurality of NAND gates each having two input terminals. The second selector 254 generates eight second selection signals and eight second sub selection signals. There are sixteen NAND gates. Two NAND gates form one pair, and therefore there are eight pairs in total. For convenience, two NAND gates forming the far left pair are referred to as seventeenth NAND gate and eighteenth NAND gate, respectively. Further, two NAND gates forming the far right pair are referred to as thirty first NAND gate and thirty second NAND gate.

One input terminal of the seventeenth NAND gate is coupled to an output terminal of the ninth NOR gate and receives the second decoding signal. Another input terminal of the seventeenth NAND gate is coupled to a positive signal line (D6). One input terminal of the eighteenth NAND gate is coupled to an output terminal of the ninth NOR gate and receives the second decoding signal. Another input terminal of the eighteenth NAND gate is coupled to a negative signal line (D6B). Through a signal line transferred through the positive signal line (D6) and the negative signal line (D6B), the seventeenth NAND gate generates a first selection signal, and the eighteenth NAND gate outputs a first sub selection signal. One bit of the data signal is transferred to the positive signal line, and a complementary bit of the one bit of the data signal is transferred to the negative signal line. In other words, a signal of "1" is transferred to the positive signal line and a signal of "0" is transferred to the negative signal line. The bit representing D6 or D6B can be referred to as a fourth bit set. If the data signal is 8 bit signals, the second lowest bit signal (D6) among the 8 bit signals is transferred to the positive signal line. If the data signal is 7 bit signals, the lowest bit signal (D6) among the 7 bit signals is transferred to the positive signal line. If the data signal is 6 bit signals, a signal of "1" is always transferred to the positive signal line.

The data voltage generator includes a first voltage divider 256 and a second voltage divider 257. The first voltage divider includes seven resistor rows coupled to each other in parallel. The second voltage divider includes two resistor rows coupled to each other in parallel.

Each resistor row of the first voltage divider 256 includes four transistors and three resistors. Two of the four transistors receive the first reference voltage through sources thereof. Drains of the two of the four transistors are coupled to one terminal of the resistor row. Gates of the two of the four transistors are coupled to the seventeenth NAND gate and the eighteen NAND gate, respectively. Sources of another two transistors are coupled to both terminals of a resistor positioned at a center of the three resistor rows. Drains of the another two transistors are coupled to an output terminal (D/A OUT). Gates of the another two transistors are coupled to the seventeenth NAND gate and the eighteenth NAND gate, respectively.

A first divider unit of the second voltage divider 257 is composed of two transistors and two resistors. The first resistor row of the second voltage divider 257 generates a data voltage according to the second selection signal from a thirty first NAND gate. A second divider unit of the second divider 257 is composed of three transistors and one resistor. Two of the three transistors operates in response to a second sub selection signal from the thirty second NAND gate. A remaining one transistor operates in response to the lowest bit (D7) of a digital data signal to cut off a second reference voltage, thereby outputting a first reference voltage which is not divided as a first reference voltage by a resistivity.

Furthermore, transistors are coupled to an output lines and operate according to a preset signal PRE and a preset bar signal PREB.

The first decoder 251 and the first selector 252 can select 8 or 16 levels, and the second decoder 254 and the second selector 255 can select another 8 or 16 levels. Therefore, total 64, 128, or 256 levels can be selected.

Figure 5:
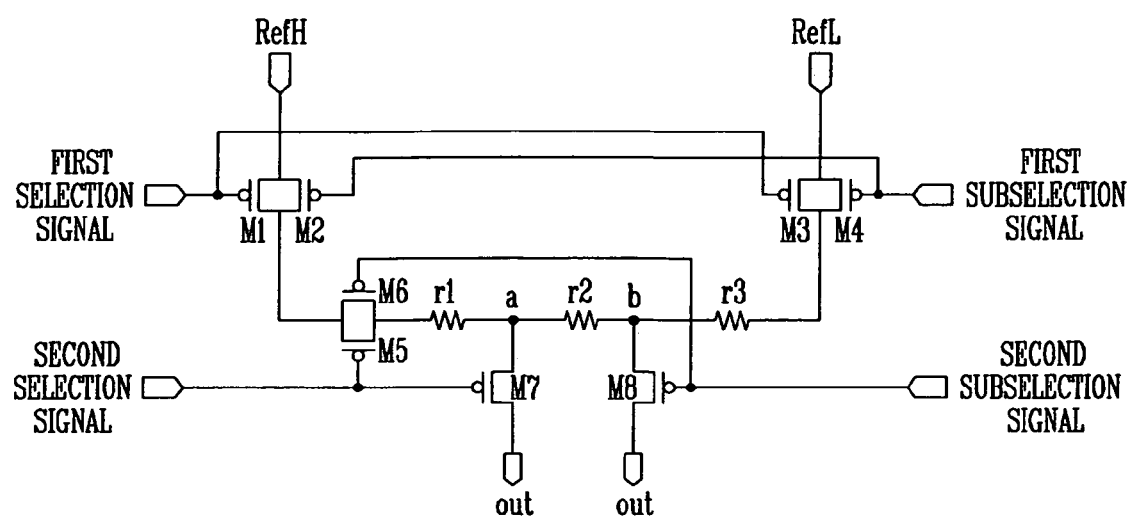
FIG. 5 is a circuit diagram showing a switch unit and a first voltage divider in the D/A converter of the present invention.
Figure 6:
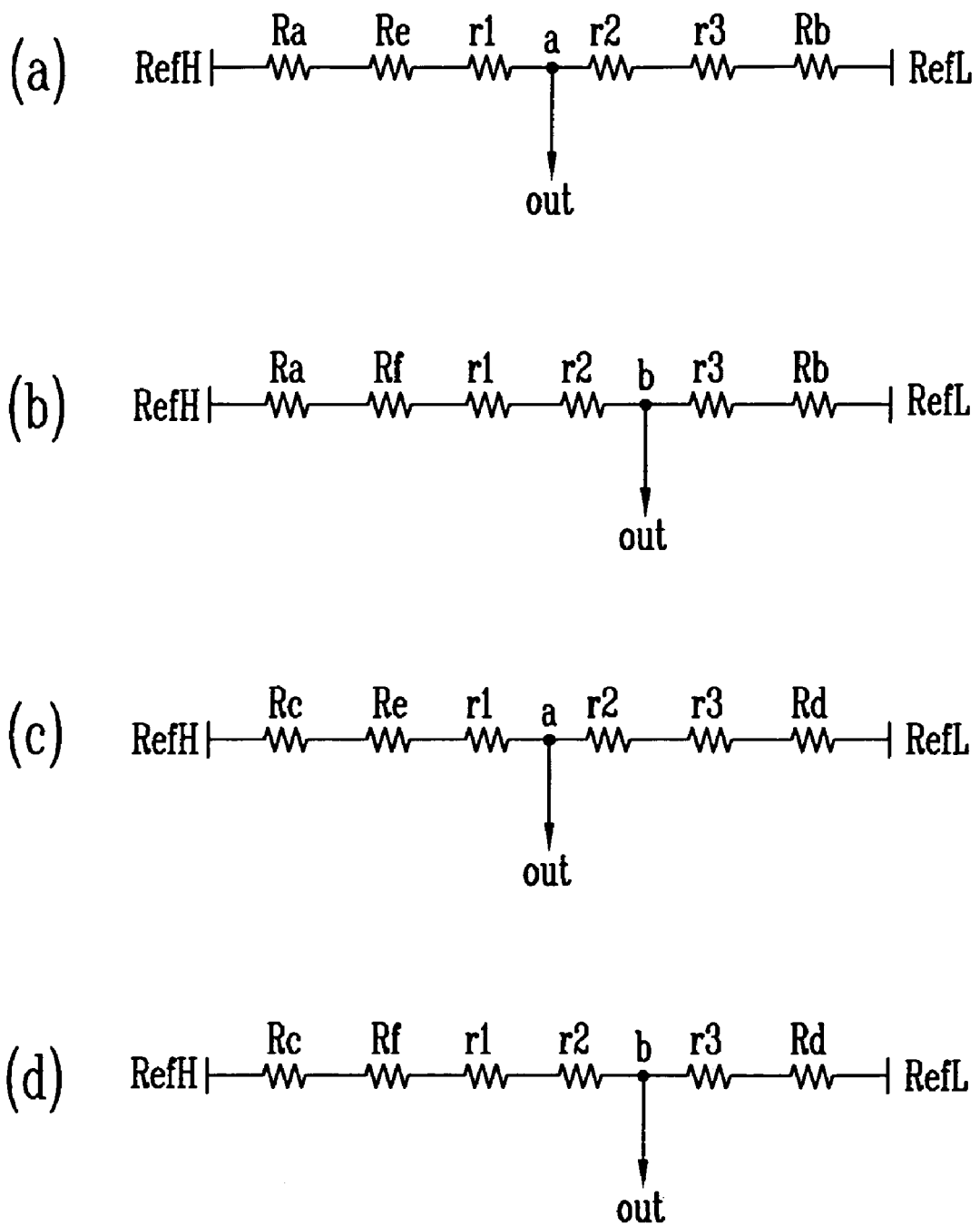
FIG. 6 is an equivalent circuitry diagram of the circuit shown in FIG. 5.

FIG. 5 is a circuit diagram showing a switch unit and a first voltage divider of the D/A converter of the present invention. FIG. 6 is an equivalent circuit diagram of circuit of FIG. 5 for generating various voltage levels in the first voltage divider shown in FIG. 5. Referring to FIG. 5, the switch unit includes a first transistor M1 and a second transistor M2 for switching a first reference voltage RefH, and a third transistor M3 and a fourth transistor M4 for switching a second reference voltage RefL. The first voltage divider includes a fifth transistor, a sixth transistor M6, a resistor unit, a seventh transistor M7, and an eighth transistor M8. The fifth transistor M5 and the sixth transistor M6 switch a first reference voltage RefH. The resistor unit includes a first, second, and third resistors r1, r2, and r3 coupled to each other in series. The seventh transistor M7 is coupled to the first and second resistors r1 and r2, and transfers a signal to an output terminal. The eighth transistor M8 is coupled to the second and third resistors r2 and r3, and transfers a signal to the output terminal. Here, a resistance of the first transistor M1, a resistance of the second transistor M2, a resistance of the third transistor M3, a resistance of the fourth transistor M4, a resistance of the fifth transistor M5, and a resistance of the sixth transistor M6, are referred Ra, Rc, Rb, Rd, Re, and Rf, respectively.

In addition, the gates of the first transistor M1 and the third transistor M3 are connected to each other, and therefore, the first and third transistors M1 and M3 are commonly controlled. The gates of the second transistor M2 and the fourth transistor M4 are connected to each other, and therefore the second and fourth transistors M2 and M4 are commonly controlled. By the same way, the fifth transistor M5 and the seventh transistor M7 are commonly controlled. The sixth transistor M6 and the eighth transistor M8 are commonly controlled. According to a switching operation of each transistor, the data voltage (a first output voltage) generator can be represented in one of the four cases as shown in FIGS. 6(a) through 6(d). Depending on whether node a or node b is selected, the ratios of the resistance changes, and therefore one of four different output voltages can be selected. Accordingly, because each resistance row of the first voltage divider can generate four different voltage levels, the first voltage divider 256 can generate total 28 different voltage levels.

Figure 7:
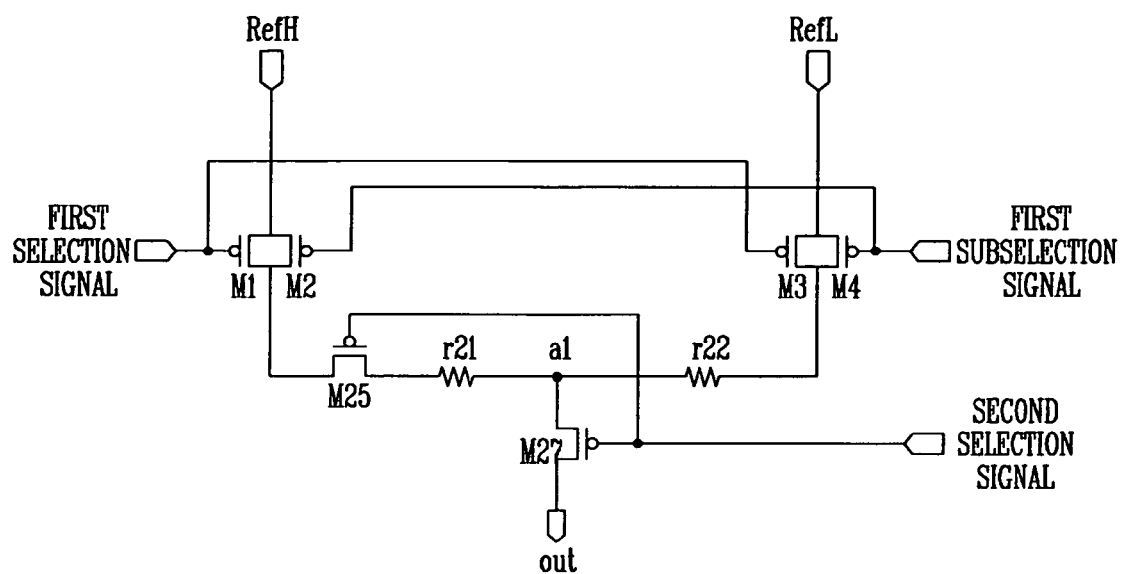
FIG. 7 is a circuitry diagram showing the switch unit and a first divider unit of a second voltage divider of the D/A converter of the present invention.
Figure 8:
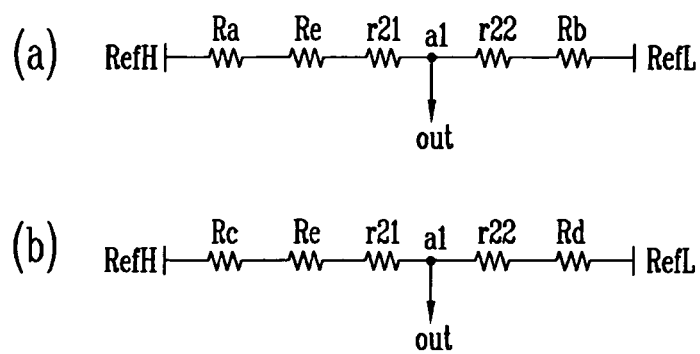
FIG. 8 is an equivalent circuitry diagram of the circuit shown in FIG. 7.

FIG. 7 is a circuitry diagram showing a switch unit and a first resistor row of a second voltage divider of the D/A converter of the present invention. FIG. 8 is an equivalent circuit diagram of a resistor unit for generating various voltage levels in the second voltage divider shown in FIG. 7. With reference to FIG. 7, the switch unit includes a first transistor M1 and a second transistor M2 for switching a first reference voltage RefH, and a third transistor M3 and a fourth transistor M4 for switching a second reference voltage RefL. The second voltage divider includes a second-fifth transistor M25, resistors, and a second-seventh transistor M27. The second-fifth transistor M25 switches a first reference voltage RefH. The resistors include second-first and second-second resistors r21 and r22 coupled to each other in series. The second-seventh transistor M27 is coupled to the second-first and second-second resistors r21 and r22, and transfers a signal to an output terminal.

It is preferred that the second-fifth transistor M25 has the same resistance as the fifth transistor M5 shown in FIG. 5, and the second-seventh transistor M27 has the same resistance as the seventh transistor M7. It is also preferred that the second-first resistors r21 has the same resistance as the first resistor r1, and the second-second resistor r22 has the same resistance as the third resistor r3. Therefore, a resistance of the first transistor M1, a resistance of the second transistor M2, a resistance of the third transistor M3, a resistance of the fourth transistor M4, and a resistance of the second-fifth transistor M25, are referred Ra, Rc, Rb, Rd, and Re, respectively.

In addition, the first transistor M1 and the third transistor M3 are commonly controlled. The second transistor M2 and the fourth transistor M4 are commonly controlled. The second-fifth transistor M25 and the second-seventh transistor M27 are commonly controlled. According to a switching operation of each transistor, the data voltage generator can be represented as one of the two cases shown in FIGS. 8(a) and (b). Since the equivalent circuits shown in FIGS. 8(a) and (b) have different ratio of resistance, the data voltage generator may output different voltage level depending on which equivalent circuit is selected.

Figure 9:
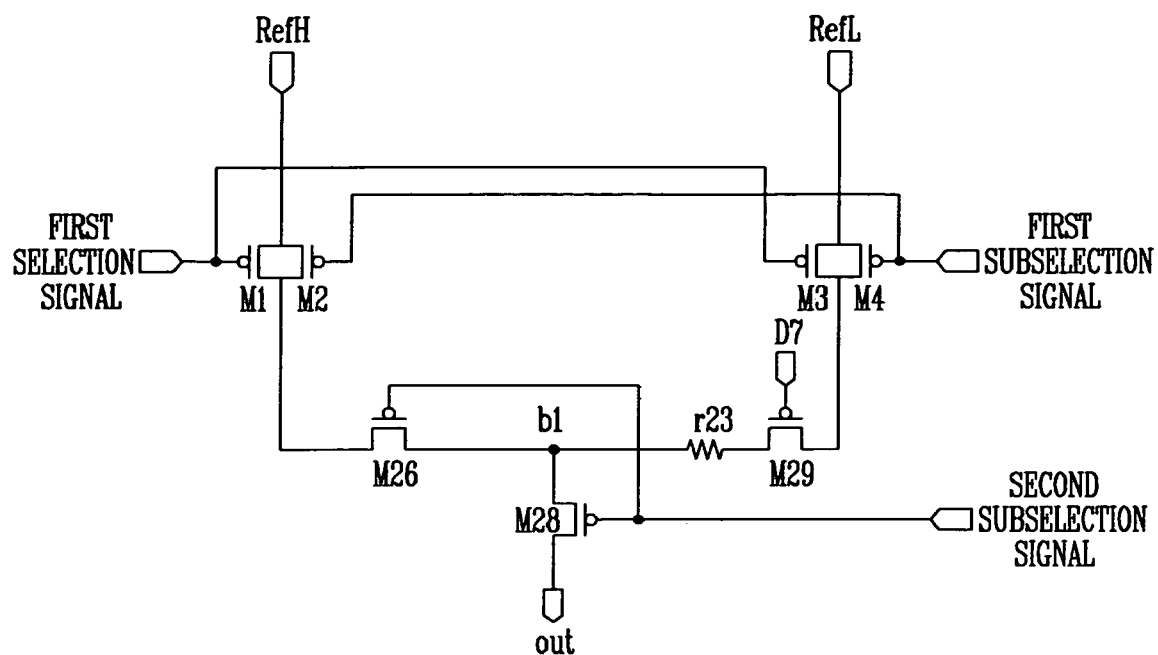
FIG. 9 is a circuitry diagram showing the switch unit and a second divider unit of the second voltage divider of the D/A converter of the present invention.

FIG. 9 is a circuitry diagram showing a switch unit and a second resistor row of the second voltage divider in the D/A converter of the present invention. With reference to FIG. 9, the switch unit includes a first transistor M1 and a second transistor M2 for switching a first reference voltage RefH, and a third transistor M3 and a fourth transistor M4 for switching a second reference voltage RefL. The second row of the second voltage divider includes a second-sixth transistor M26, a second-third resistor r23, a second-eighth transistor M28, and a second-ninth transistor M29. The second-sixth transistor M26 switches the first reference voltage RefH. The second-eighth transistor M28 is coupled between the second-sixth transistor M26 and the second-third resistor r23, and transfers a signal to an output terminal. The second-ninth transistor M29 is coupled between the second-third resistor r23 and the third and fourth transistors M3 and M4, and performs a switching operation using the lowest bit D7 of a data signal.

It is preferred that the second-sixth transistor M26 has the same resistance as the fifth transistor M6 shown in FIG. 5, and the second-eighth transistor M28 has the same resistance as the seventh transistor M8. It is also preferred that the second-third resistor r23 has the same resistance as the third resistor r3. Therefore, a resistance of the first transistor M1, a resistance of the second transistor M2, a resistance of the third transistor M3, a resistance of the fourth transistor M4, and a resistance of the second-sixth transistor M6, a resistance of the second-ninth transistor M9 are referred as Ra, Rc, Rb, Rd, Re, and Rsw respectively.

Figure 10:
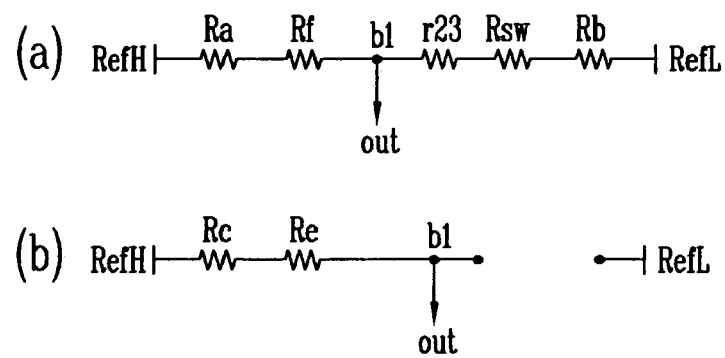
FIG. 10 is an equivalent circuitry diagram of the circuit shown in FIG. 9.

In addition, the first transistor M1 and the third transistor M3 are commonly controlled. The second transistor M2 and the fourth transistor M4 are commonly controlled. The second-sixth transistor M6 and the second-eighth transistor M8 are commonly controlled. FIG. 10 is an equivalent circuitry diagram of a resistor row for generating various voltage levels in the second resistor row of the second voltage divider shown in FIG. 9. According to a switching operation of each transistor, the data voltage generator can be represented as one of the two cases as shown in FIGS. 10(a) and (b). The data voltage generator may output one of the two voltage levels between the first reference voltage RefH and the second reference voltage RefL. At this time, when the lowest bit is selected, a second reference voltage RefL is cut off by the second-ninth transistor M29 as shown in FIG. 10(b). Accordingly, a first reference voltage RefH is selected and outputted.

Figure 11:
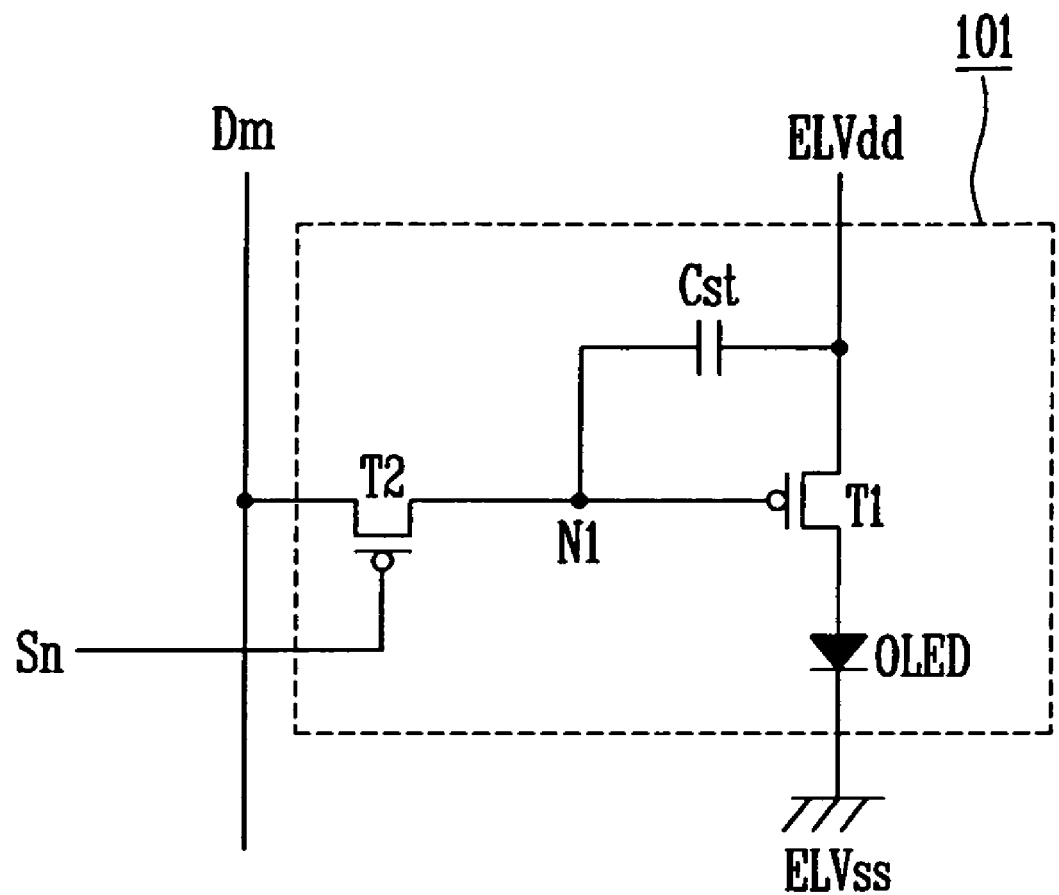
FIG. 11 is an example of an equivalent circuitry diagram of a pixel of the organic light emitting display shown in FIG. 1.

FIG. 11 is a circuitry diagram showing an example of a pixel used in the organic light emitting display shown in FIG. 1. Referring to FIG. 11, a pixel 101 is coupled to a data line Dm, a scan line Sn, and a pixel power line ELVdd, and includes a first pixel transistor T1, a second pixel transistor T2, a capacitor Cst, and an organic light emitting diode OLED.

A source of the first pixel transistor T1 is coupled to the pixel power line ELVdd, a drain thereof is coupled to a source of the third transistor M3, and a gate thereof is coupled to a first node N1. A source of the second pixel transistor T2 is coupled to the data line Dm, a drain thereof is coupled to the first node N1, and a gate thereof is coupled to the scan line Sn. The capacitor Cst is coupled between the first node N1 and the pixel power line ELVdd, and maintains a voltage between the first node N1 and the pixel power line ELVdd. The organic light emitting diode OLED includes an anode electrode, a cathode electrode, and an emission layer. The anode electrode of the organic light emitting diode OLED is coupled to the drain of the first pixel transistor T1, and a cathode electrode thereof is coupled to a power supply ELVSS of a low potential. When an electric current flows from the anode electrode of the organic light emitting diode OLED to the cathode electrode thereof according to a voltage applied to a gate of the first pixel transistor T1, the emission layer emits light and the brightness is adjusted corresponding to an electric current amount.

The driving circuit and the organic light emitting display using the same according to the present invention convert a digital data signal into an analog data signal according to the bit number of the data signal, which can be variously in an organic light emitting display.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A driving circuit for generating a data voltage, comprising:
   a first decoder for receiving a first bit set of a digital data signal and outputting a first decoding signal;
   a first selector for receiving a third bit set of the digital data signal and the first decoding signal, the first selector outputting a first selection signal and a first sub selection signal;
   a switch unit for receiving the first selection signal and the first sub selection signal, the switch unit receiving a first reference voltage and a second reference voltage, magnitude of the second reference being smaller than magnitude of the first reference voltage, the switch unit outputting a first switch output voltage and a second switch output voltage, each of magnitude of the first switch output voltage and magnitude of the second switch output voltage depending on magnitude of the first selection signal;
   a second decoder for receiving a second bit set of the digital data signal and outputting a second decoding signal;
   a second selector for receiving a fourth bit set of the digital data signal and the second decoding signal, the second selector outputting a second selection signal and a second sub selection signal;
   a first voltage divider for receiving the first switch output voltage and the second switch output voltage, the first voltage divider receiving the second selection signal and the second sub selection signal, the first voltage divider outputting a first output voltage, magnitude of the first output voltage depending on magnitude of the second selection signal; and a second voltage divider including:

a first divider unit for receiving the first switch output voltage and the second switch output voltage, the first divider unit receiving the second selection signal, the first divider unit outputting a second output voltage, magnitude of the second output voltage depending on magnitude of the second selection signal; and a second divider unit for receiving the first switch output voltage and the second switch output voltage, the second divider unit receiving the second sub selection signal, the second divider unit outputting a third output voltage, magnitude of the third output voltage depending on magnitude of the second sub selection signal.

2. The driving circuit as claimed in claim 1, wherein the third bit set includes a single bit of the digital data signal.

3. The driving circuit as claimed in claim 1, wherein the fourth bit set includes a single bit of the digital data signal.

4. The driving circuit as claimed in claim 1, wherein the switch unit comprises:

a first transistor for receiving the first reference voltage, operation of the first transistor being controlled by the first selection signal;

a second transistor for receiving the first reference voltage, operation of the second transistor being controlled by the first sub selection signal, the first switch output voltage being outputted from the first transistor or from the second transistor;

a third transistor for receiving the second reference voltage, operation of the third transistor being controlled by the first selection signal; and a fourth transistor for receiving the second reference voltage, operation of the fourth transistor being controlled by the first sub selection signal, the second switch output voltage being outputted from the third transistor or from the fourth transistor.

5. The driving circuit as claimed in claim 1, wherein the first voltage divider comprises:

a fifth transistor for receiving the first switch output voltage, operation of the fifth transistor being controlled by the second selection signal;

a sixth transistor for receiving the first switch output voltage, operation of the sixth transistor being controlled by the second sub selection signal;

a seventh transistor for receiving an output voltage from the fifth transistor or from the sixth transistor, operation of the seventh transistor being controlled by the second selection signal;

a eighth transistor for receiving the second switch output voltage, operation of the eighth transistor being controlled by the second sub selection signal;

a first resistor coupled between the seventh transistor and the fifth transistor;

a second resistor coupled between the seventh transistor and the eighth transistor; and a third resistor coupled between the eighth transistor and an output terminal of the switch unit from which the second switch output voltage is outputted.

6. The driving circuit as claimed in claim 5, wherein the first divider unit of the second voltage divider comprises:

a second-fifth transistor for receiving the first switch output voltage, operation of the second-fifth transistor being controlled by the second selection signal;

a second-seventh transistor for receiving an output voltage from the second-fifth transistor, operation of the second-seventh transistor being controlled by the second selection signal;

a second-first resistor coupled between the second-fifth transistor and the second-seventh transistor; and a second-second resistor coupled between the second-seventh transistor and an output terminal of the switch unit from which the second switch output voltage is outputted.

7. The driving circuit as claimed in claim 6, wherein the second divider unit of the second voltage divider comprises:

a second-sixth transistor for receiving the first switch output voltage, operation of the second-sixth transistor being controlled by the second sub selection signal;

a second-eighth transistor for receiving an output voltage from the second-sixth transistor, operation of the second-eighth transistor being controlled by the second sub selection signal;

a ninth transistor for receiving the second switch output voltage, operation of the ninth transistor being controlled by magnitude of a bit signal outputted from the third bit set of the digital signal; and a second-third resistor coupled between the second-eighth transistor and the ninth transistor.

8. The driving circuit as claimed in claim 7, wherein resistance of the fifth transistor is substantially the same as resistance of the second-fifth transistor;

resistance of the sixth transistor is substantially the same as resistance of the second-sixth transistor;

resistance of the first resistor is substantially the same as resistance of the second-first resistor; and resistance of the third resistor is substantially the same as resistance of the second-second resistor and resistance of the second-third resistor.

9. The driving circuit as claimed in claim 1, wherein the first reference voltage and the second reference voltage are selected among nine reference voltages.

10. The driving circuit as claimed in claim 1, wherein the magnitude of the first output voltage further depends on magnitude of the first selection signal.

11. A data driver, comprising:

a shift register for sequentially outputting a control signal;

a latch for receiving digital data signals in series and outputting the digital data signals in parallel, the process of converting the data signal from series to parallel being controlled by the control signal;

a digital-analog converter for converting the digital data signals into data voltages, the digital analog converter comprising:

a first decoder for receiving a first bit set of a digital data signal and outputting a first decoding signal;

a first selector for receiving a third bit set of the digital data signal and the first decoding signal, the first selector outputting a first selection signal and a first sub selection signal;

a switch unit for receiving the first selection signal and the first sub selection signal, the switch unit receiving a first reference voltage and a second reference voltage, magnitude of the second reference being smaller than magnitude of the first reference voltage, the switch unit outputting a first switch output voltage and a second switch output voltage, each of magnitude of the first switch output voltage and magnitude of the second switch output voltage depending on magnitude of the first selection signal;

a second decoder for receiving a second bit set of the digital data signal and outputting a second decoding signal;

a second selector for receiving a fourth bit set of the digital data signal and the second decoding signal, the second selector outputting a second selection signal and a second sub selection signal;

a first voltage divider for receiving the first switch output voltage and the second switch output voltage, the first voltage divider receiving the second selection signal and the second sub selection signal, the first voltage divider outputting a first output voltage, magnitude of the first output voltage depending on both of magnitude of the second selection signal and magnitude of the first selection signal; and a second voltage divider including:
a first divider unit for receiving the first switch output voltage and the second switch output voltage, the first divider unit receiving the second selection signal, the first divider unit outputting a second output voltage, magnitude of the second output voltage depending on magnitude of the second selection signal; and a second divider unit for receiving the first switch output voltage and the second switch output voltage, the second divider unit receiving the second sub selection signal, the second divider unit outputting a third output voltage, magnitude of the third output voltage depending on magnitude of the second sub selection signal; and a buffer receiving the data voltages and amplifying the data voltages.

12. The data driver as claimed in claim 11, wherein the third bit set includes a single bit of the digital data signal.

13. The data driver as claimed in claim 11, wherein the fourth bit set includes a single bit of the digital data signal.

14. The data driver as claimed in claim 11, wherein the switch unit comprises:

a first transistor for receiving the first reference voltage, operation of the first transistor being controlled by the first selection signal;

a second transistor for receiving the first reference voltage, operation of the second transistor being controlled by the first sub selection signal, the first switch output voltage being outputted from the first transistor or from the second transistor;

a third transistor for receiving the second reference voltage, operation of the third transistor being controlled by the first selection signal; and a fourth transistor for receiving the second reference voltage, operation of the fourth transistor being controlled by the first sub selection signal, the second switch output voltage being outputted from the third transistor or from the fourth transistor.

15. The data driver as claimed in claim 14, wherein the first voltage divider comprises:

a fifth transistor for receiving the first switch output voltage, operation of the fifth transistor being controlled by the second selection signal;

a sixth transistor for receiving the first switch output voltage, operation of the sixth transistor being controlled by the second sub selection signal;

a seventh transistor for receiving an output voltage from the fifth transistor or from the sixth transistor, operation of the seventh transistor being controlled by the second selection signal;

a eighth transistor for receiving the second switch output voltage, operation of the eighth transistor being controlled by the second sub selection signal;

a first resistor coupled between the seventh transistor and the fifth transistor;

a second resistor coupled between the seventh transistor and the eighth transistor; and a third resistor coupled between the eighth transistor and an output terminal of the switch unit from which the second switch output voltage is outputted.

16. The data driver as claimed in claim 15, wherein the first divider unit of the second voltage divider comprises:

a second-fifth transistor for receiving the first switch output voltage, operation of the second-fifth transistor being controlled by the second selection signal;

a second-seventh transistor for receiving an output voltage from the second-fifth transistor, operation of the second-seventh transistor being controlled by the second selection signal;

a second-first resistor coupled between the second-fifth transistor and the second-seventh transistor; and a second-second resistor coupled between the second-seventh transistor and an output terminal of the switch unit from which the second switch output voltage is outputted.

17. The data driver as claimed in claim 16, wherein the second divider unit of the second voltage divider comprises:

a second-sixth transistor for receiving the first switch output voltage, operation of the second-sixth transistor being controlled by the second sub selection signal;

a second-eighth transistor for receiving an output voltage from the second-sixth transistor, operation of the second-eighth transistor being controlled by the second sub selection signal;

a ninth transistor for receiving the second switch output voltage, operation of the ninth transistor being controlled by magnitude of a bit signal outputted from the third bit set of the digital signal; and a second-third resistor coupled between the second-eighth transistor and the ninth transistor.

18. The data driver as claimed in claim 17, wherein resistance of the fifth transistor is substantially the same as the resistance of the second-fifth transistor, and resistance of the sixth transistor is substantially the same as the resistance of the second-sixth transistor.

19. An organic light emitting display comprising:
a pixel unit for receiving a data voltage and a scan signal and for displaying images;

a scan driver for generating the scan signal; and a data driver for generating the data voltage, the data driver comprising:

a first decoder for receiving a first bit set of a digital data signal and outputting a first decoding signal;

a first selector for receiving a third bit set of the digital data signal and the first decoding signal, the first selector outputting a first selection signal and a first sub selection signal;

a switch unit for receiving the first selection signal and the first sub selection signal, the switch unit receiving a first reference voltage and a second reference voltage, magnitude of the second reference being smaller than magnitude of the first reference voltage, the switch unit outputting a first switch output voltage and a second switch output voltage, each of magnitude of the first switch output voltage and magnitude of the second switch output voltage depending on magnitude of the first selection signal;

a second decoder for receiving a second bit set of the digital data signal and outputting a second decoding signal;

a second selector for receiving a fourth bit set of the digital data signal and the second decoding signal, the second selector outputting a second selection signal and a second sub selection signal;

a first voltage divider for receiving the first switch output voltage and the second switch output voltage, the first voltage divider receiving the second selection signal and the second sub selection signal, the first voltage divider outputting a first output voltage, magnitude of the first output voltage depending on magnitude of the second selection signal; and a second voltage divider including:
   a first divider unit for receiving the first switch output voltage and the second switch output voltage, the first divider unit receiving the second selection signal, the first divider unit outputting a second output voltage, magnitude of the second output voltage depending on magnitude of the second selection signal; and
   a second divider unit for receiving the first switch output voltage and the second switch output voltage, the second divider unit receiving the second sub selection signal, the second divider unit outputting a third output voltage, magnitude of the third output voltage depending on magnitude of the second sub selection signal.

20. The organic light emitting display as claimed in claim 19, wherein the third bit set includes a single bit of the digital data signal.

21. The organic light emitting display as claimed in claim 19, wherein the fourth bit set includes a single bit of the digital data signal.

22. The organic light emitting display as claimed in claim 19, wherein the switch unit comprises:
   a first transistor for receiving the first reference voltage, operation of the first transistor being controlled by the first selection signal;
   a second transistor for receiving the first reference voltage, operation of the second transistor being controlled by the first sub selection signal, the first switch output voltage being outputted from the first transistor or from the second transistor;
   a third transistor for receiving the second reference voltage, operation of the third transistor being controlled by the first selection signal; and
   a fourth transistor for receiving the second reference voltage, operation of the fourth transistor being controlled by the first sub selection signal, the second switch output voltage being outputted from the third transistor or from the fourth transistor.

23. The organic light emitting display as claimed in claim 19, wherein the first voltage divider comprises:
   a fifth transistor for receiving the first switch output voltage, operation of the fifth transistor being controlled by the second selection signal;
   a sixth transistor for receiving the first switch output voltage, operation of the sixth transistor being controlled by the second sub selection signal;
   a seventh transistor for receiving an output voltage from the fifth transistor or from the sixth transistor, operation of the seventh transistor being controlled by the second selection signal;
   a eighth transistor for receiving the second switch output voltage, operation of the eighth transistor being controlled by the second sub selection signal;
   a first resistor coupled between the seventh transistor and the fifth transistor;
   a second resistor coupled between the seventh transistor and the eighth transistor; and
   a third resistor coupled between the eighth transistor and an output terminal of the switch unit from which the second switch output voltage is outputted.

24. The organic light emitting display as claimed in claim 23, wherein the first divider unit of the second voltage divider comprises:
   a second-fifth transistor for receiving the first switch output voltage, operation of the second-fifth transistor being controlled by the second selection signal;
   a second-seventh transistor for receiving an output voltage from the second-fifth transistor, operation of the second-seventh transistor being controlled by the second selection signal;
   a second-first resistor coupled between the second-fifth transistor and the second-seventh transistor; and
   a second-second resistor coupled between the second-seventh transistor and an output terminal of the switch unit from which the second switch output voltage is outputted.

25. The organic light emitting display as claimed in claim 24, wherein the second divider unit of the second voltage divider comprises:
   a second-sixth transistor for receiving the first switch output voltage, operation of the second-sixth transistor being controlled by the second sub selection signal;
   a second-eighth transistor for receiving an output voltage from the second-sixth transistor, operation of the second-eighth transistor being controlled by the second sub selection signal;
   a ninth transistor for receiving the second switch output voltage, operation of the ninth transistor being controlled by magnitude of a bit signal outputted from the third bit set of the digital signal; and
   a second-third resistor coupled between the second-eighth transistor and the ninth transistor.

26. The organic light emitting display as claimed in claim 25, wherein resistance of the fifth transistor is substantially the same as the resistance of the second-fifth transistor, and resistance of the sixth transistor is substantially the same as the resistance of the second-sixth transistor.

27. The organic light emitting display as claimed in claim 19, wherein the first reference voltage and the second reference voltage are selected among nine reference voltages.

28. The organic light emitting display as claimed in claim 19, wherein the magnitude of the first output voltage further depends on magnitude of the first selection signal.

29. A method for driving an organic light emitting display, the method comprising:
   transferring a first bit set of a digital data signal to a first decoder, and outputting a first decoding signal from the first decoder;
   transferring a third bit set of the digital data signal and the first decoding signal to a first selector, and outputting a first selection signal and a first sub selection signal from the first selector;
   transferring the first selection signal and the first sub selection signal to a switch unit;

transferring a first reference voltage and a second reference voltage to the switch unit, magnitude of the second reference being smaller than magnitude of the first reference voltage;

outputting a first switch output voltage and a second switch output voltage from the switch unit, each of magnitude of the first switch output voltage and magnitude of the second switch output voltage depending on magnitude of the first selection signal;

transferring a second bit set of the digital data signal to a second decoder, and outputting a second decoding signal from the second decoder;

transferring a fourth bit set of the digital data signal and the second decoding signal to a second selector, and outputting a second selection signal and a second sub selection signal from the second selector;

transferring the first switch output voltage and the second switch output voltage to a first voltage divider;

transferring the second selection signal and the second sub selection signal to the first voltage divider;

outputting a first output voltage from the first voltage divider, magnitude of the first output voltage depending on magnitude of the second selection signal;

transferring the first switch output voltage and the second switch output voltage to a first divider unit of a second voltage divider;

transferring the second selection signal to the first divider unit of the second voltage divider;

outputting a second output voltage from to the first divider unit of the second voltage divider, magnitude of the second output voltage depending on magnitude of the second selection signal;

transferring the first switch output voltage and the second switch output voltage to a second divider unit of the second voltage divider;

transferring the second sub selection signal to the second divider unit of the second voltage divider; and outputting a third output voltage from the second divider unit of the second voltage divider, magnitude of the third output voltage depending on magnitude of the second sub selection signal.

30. The method as claimed in claim 29, further comprising selecting the first reference voltage and the second reference voltage among nine reference voltages.

31. The method as claimed in claim 29, wherein the magnitude of the first output voltage further depends on magnitude of the first selection signal.

* * * * *